(12) United States Patent
Hiraishi et al.

(10) Patent No.: US 7,098,395 B2
(45) Date of Patent: Aug. 29, 2006

(54) THIN-FILM SOLAR CELL MODULE OF SEE-THROUGH TYPE

(75) Inventors: Masafumi Hiraishi, Toyooka (JP); Naoaki Nakanishi, Kobe (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 10/107,232

(22) Filed: Mar. 26, 2002

(65) Prior Publication Data
US 2002/0139411 A1   Oct. 3, 2002

(30) Foreign Application Priority Data
Mar. 29, 2001   (JP)   .............................. 2001-096787
Mar. 30, 2001   (JP)   .............................. 2001-102370

(51) Int. Cl.
*H01L 31/042*   (2006.01)
*H01L 27/142*   (2006.01)
*H01L 31/048*   (2006.01)

(52) U.S. Cl. ...................... 136/251; 136/244; 257/433; 257/432; 257/434; 438/66; 438/67; 438/64; 438/80; 438/73

(58) Field of Classification Search ................ 136/244, 136/251; 257/433, 432, 434; 438/66, 67, 438/80, 64, 73
See application file for complete search history.

(56) References Cited

U.S. PATENT DOCUMENTS

| | | | | |
|---|---|---|---|---|
| 4,663,495 A | * | 5/1987 | Berman et al. | 136/248 |
| 4,667,058 A | * | 5/1987 | Catalano et al. | 136/244 |
| 4,795,500 A | * | 1/1989 | Kishi et al. | 136/244 |
| 5,011,544 A | * | 4/1991 | Gaddy et al. | 136/246 |
| 5,059,254 A | * | 10/1991 | Yaba et al. | 136/251 |
| 5,252,139 A | * | 10/1993 | Schmitt et al. | 136/251 |
| 5,254,179 A | * | 10/1993 | Ricaud et al. | 136/244 |
| 5,593,901 A | * | 1/1997 | Oswald et al. | 438/80 |
| 5,741,855 A | * | 4/1998 | Kaduk et al. | 525/88 |
| 6,414,236 B1 | * | 7/2002 | Kataoka et al. | 136/251 |
| 6,468,828 B1 | * | 10/2002 | Glatfelter et al. | 438/80 |
| 6,660,930 B1 | * | 12/2003 | Gonsiorawski | 136/251 |

FOREIGN PATENT DOCUMENTS

| | | |
|---|---|---|
| EP | 0 500 451 | 8/1992 |
| EP | 0 840 381 | 5/1998 |
| EP | 1 122 797 | 8/2001 |
| JP | 05-251723 A | 9/1993 |
| JP | 09-116180 A | 5/1997 |
| JP | 2001-077381 A | 3/2001 |
| JP | 2001-358356 A | 12/2001 |

OTHER PUBLICATIONS

Machine English translation of JP 2001-358356 A, Dec. 2001.*

* cited by examiner

*Primary Examiner*—Alan Diamond
(74) *Attorney, Agent, or Firm*—Hogan & Hartson LLP (57) ABSTRACT

A thin-film solar cell module of a see-through structure has a plurality of integrated thin-film solar cell segments, each having a rectangular surface, provided on at least a portion of a surface region of a light-transmitting substrate having a rectangular surface and are spaced apart from each other. Adjacent solar cell segments are spaced apart at substantially regular intervals, with their long sides extending parallel to each other. Those portions of the substrate, which lie between the solar cell segments, are exposed, defining light-transmitting windows. A transparent sealing resin fills the gaps between the adjacent solar cell segments.

11 Claims, 7 Drawing Sheets

THIN-FILM SOLAR CELL MODULE OF SEE-THROUGH TYPE

CROSS-REFERENCE TO RELATED APPLICATIONS

This application is based upon and claims the benefit of priority from the prior Japanese Patent Applications No. 2001-096787, filed Mar. 29, 2001; and No. 2001-102370, filed Mar. 30, 2001, the entire contents of both of which are incorporated herein by reference.

BACKGROUND OF THE INVENTION

1. Field of the Invention

The present invention relates to a thin-film solar cell module of see-through type.

2. Description of the Related Art

In general, see-through type, thin-film solar cell modules are manufactured in the following manner. First, a transparent front electrode, an amorphous silicon photovoltaic unit and a rear metal electrode are formed on a glass substrate in the order mentioned. Then, a number of through holes and grooves are made in the rear metal electrode and photovoltaic unit. A see-through type, solar cell module having the above-described structure generates electric power when light is applied to the transparent front. At the same time the module generates power, the light passes through the through holes. Therefore, the module reliably acquires see-through property at the entire surface.

To make through holes in the rear metal electrode and photovoltaic unit, however, a two-step etching process must be performed (usually, wet-etching on the rear metal electrode, and dry etching on the photovoltaic unit). Consequently, the process of manufacturing the module is complicated.

BRIEF SUMMARY OF THE INVENTION

An object of the present invention is to provide a thin-film solar cell module that can be manufactured by a sample method and has a see-through structure providing a light-transmitting window of an arbitrary pattern, which conventional techniques cannot provide.

According to a first aspect of the present invention, there is provided a thin-film solar cell module of a see-through structure comprising: a light-transmitting substrate having a rectangular surface; and a plurality of integrated thin-film solar cell segments provided on at least a portion of the surface of the substrate, and spaced apart from each other, each having a substantially rectangular surface, wherein two adjacent solar cell segments extend substantially parallel to each other and spaced from each other, exposing the surface of the substrate and defining a light-transmitting window therebetween, and a gap between two adjacent solar cell segments is filled with a transparent resin.

According to a second aspect of the present invention, there is provided a thin-film solar cell panel comprising: a light-transmitting sealing member; and a plurality of thin-film solar cell modules according to the present invention, provided adjacent to one another on the light-transmitting sealing member such that the transparent sealing resin contacts the light-transmitting sealing member, wherein the see-through type, thin-film solar cell modules are electrically connected to each other.

According to a third aspect of the present invention, there is provided a thin-film solar cell module of a see-through structure comprising: a light-transmitting substrate; and an integrated solar cell structure including a plurality of thin-film solar cell unit cells provided on at least a portion of the rear of the light-transmitting substrate, each unit cell having a transparent front electrode layer, a photovoltaic unit and a rear electrode layer, wherein the transparent front electrode layer is exposed at at least a portion of the integrated solar cell structure, forming a light-transmitting window, and the exposed transparent front electrode layer ensures a flow of an electric current in the integrated thin-film solar cell structure.

In this specification, a side to which light is applied shall be called "front," and the opposite side as "rear."

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Several embodiments of the present invention will be described in detail with reference to the accompanying drawing Figures. Throughout the Figures, the same elements are designated at the same reference numerals and symbols.

Figure 1:
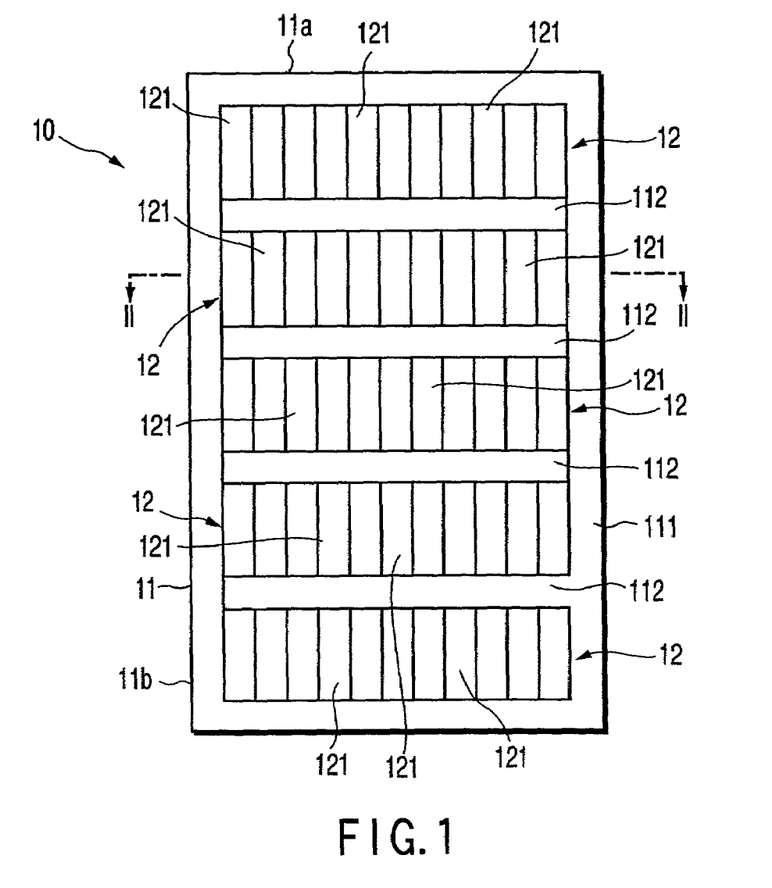
FIG. 1 is a plan view of a see-through type, thin-film solar cell module according to an embodiment of the present invention.
Figure 2:
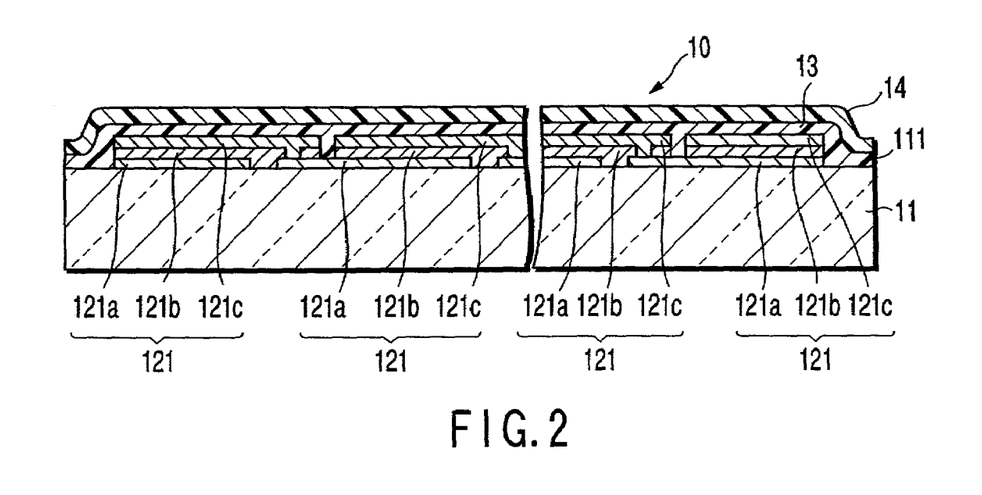
FIG. 2 is an enlarged, cross sectional view taken along the line II—II in FIG. 1.

FIG. 1 is a plan view of a see-through type, thin-film solar cell module according to an embodiment of the invention. FIG. 2 is a partially cutaway, enlarged cross sectional view taken along the line II—II in FIG. 1, showing a portion of the module. For simplicity, the transparent sealing resin layer and sealing member shown in FIG. 2 are not illustrated in FIG. 1.

As shown in FIGS. 1 and 2, a see-through type, thin-film solar cell module 10 according to one embodiment of the present invention comprises a plurality of integrated thin-film solar cell (discrete) segments 12 (five segments, in FIG. 1). The segments 12 are provided on a light-transmitting (transparent) substrate 11 (for example, glass substrate) that has a rectangular surface, covering one entire surface of the substrate 11, but the peripheral portion 111. The integrated thin-film solar cell segments 12 have rectangular surfaces of substantially the same size. The segments 12 are arranged side by side, with their long sides extending parallel to one another, and spaced at substantially regular intervals. Usually, the long sides of each segment 12 extend parallel to short side 11a of the rectangular substrate 11, and the short sides of each segment 12 extend parallel to the long side 11b of the substrate 11. The short sides of the segments 12 are aligned in straight lines that intersect with the short side 11a of the substrate 11 at right angles. A portion 112 of the surface of the substrate 11 is exposed between any two adjacent solar cell segments 12. (In other words, no solar cell unit cells are provided between any two adjacent segments 12.) The gap (exposed portion of the substrate surface) between any two adjacent solar cell segments 12 serves as a light-transmitting window.

The rectangular substrate has a size of, for example, 910 mm×455 mm. Nonetheless, it may have a size of 910 mm×910 mm (square). The short sides of each segment 12 may be at least 30 mm long (usually, not longer than 300 mm). The window 112 may be 0.5 mm to 50 mm wide. The peripheral portion 111 may be 5 mm to 150 mm wide.

Each integrated thin-film solar cell segment 12 comprises solar cell unit cells integrated together; it is of the ordinary structure as best illustrated in FIG. 2. More specifically, each segment 12 comprises a plurality of solar cell unit cells 121 integrated on the light-transmitting substrate 11. Each unit cell 121 comprises a transparent front electrode layer 121a, an amorphous silicon-based photovoltaic unit 121b, and a rear metal electrode layer 121c. The layer 121a, unit 121b and layer 121c are formed on the transparent substrate 11, laid one upon another in the order mentioned.

The transparent front electrode layer 121a provided on the glass substrate 11 can be made of transparent electrically conductive oxide such as ITO, $SnO_2$ or ZnO. The electrode layer 121a may be a single-layer structure or a multi-layer structure. Either structure can be formed by a vapor deposition process known pre se in the art, such as evaporation, CVD or sputtering.

The amorphous silicon-based photovoltaic unit 121b, which is formed on the transparent front electrode layer 121a, is a multi-layer structure. The unit 121b comprises a p-type amorphous silicon-based semiconductor layer, an amorphous silicon-based thin-film photovoltaic conversion layer, and an n-type silicon-based semiconductor layer, not shown in the Figures. These three layers are formed on the electrode layer 121a, one upon another in the order mentioned. The p-type amorphous silicon-based semiconductor layer, amorphous silicon-based thin-film photovoltaic conversion layer and n-type silicon-based semiconductor layer can be formed by a plasma CVD process. The p-type amorphous silicon-based semiconductor layer may be made of silicon, silicon hydride (Si:H), or amorphous silicon-based semiconductor material (e.g., a silicon alloy such as silicon carbide or silicon germanium). This semiconductor layer is doped with p-type determining impurity atoms such as boron atoms or aluminum atoms. The photovoltaic conversion layer may be formed of intrinsic semiconductor such as silicon (or silicon hydride) or amorphous silicon-based semiconductor material (e.g., a silicon alloy such as silicon carbide or silicon germanium). Alternatively, a weak p-type or weak n-type amorphous silicon-based semiconductor material that contains a very small amount of a conductivity-type determining impurity may be used for the photovoltaic conversion layer, provided that the material has a sufficient photovoltaic conversion function. The photovoltaic conversion layer is formed, usually to a thickness ranging from 0.1 μm to 10 μm. The n-type silicon-based semiconductor layer may be made of silicon, silicon hydride, or an amorphous silicon-based semiconductor material (e.g., a silicon alloy such as silicon carbide or silicon germanium). This semiconductor layer is doped with n-type determining impurity atoms such as phosphorous atoms or nitrogen atoms. Alternatively, the n-type silicon-based semiconductor layer may be made of an n-type microcrystalline silicon hydride.

The rear electrode layer 121c, which is formed on the photovoltaic unit 121b, can be formed of a metallic material such as silver, aluminum, chromium or titanium, by means of, for example, evaporation or sputtering.

The transparent front electrode layer 121a, the amorphous silicon-based photovoltaic unit 121b and the rear electrode layer 121c, all described above, are divided into a plurality of unit cells 121, by, for example, laser scribing. The unit cells 121 are electrically connected in series or in parallel. As is clear from the above, the transparent front electrode layer 121a, amorphous silicon-based photovoltaic unit 121b and rear electrode layer 121c of each solar cell segment 12 extend in parallel to the short sides of the rectangle that the unit cells 121 define.

As shown in FIG. 1, the peripheral region 111 of the glass substrate 11 is treated with, for example, sand-blasting. The rear electrode layer, photovoltaic unit and transparent front electrode layer, which have been deposited for the manufacture of the cell 12, are thereby removed from the glass substrate 11. The glass surface 11 is therefore exposed at the peripheral region 111. Now that the glass substrate 11 is so exposed, the substrate can be firmly adhered to a sealing resin, which will be explained later.

The rear of the solar cell module described above is sealed and protected by a transparent sealing member, such as a transparent film 14, which is provided on a transparent sealing resin layer (adhesive layer) 13 covering the rear of the module (See FIG. 2).

The transparent sealing resin used in the present invention is of a type which can seal entirely the unit cells 121 formed on the glass substrate 11 and which can firmly adhere to the sealing member such as the protection film 14. The resin can soften and eventually melt when heated, and can then cure. Usually, an organic peroxide-based cross-linking agent is blended in the resin. Examples of the resin are thermoplastic resins such as ethylene/vinyl acetate copolymer resin (EVA), ethylene/vinyl acetate/triallylisocyanurate copolymer resin (EVAT), polyvinylbutyral (PVB) and polyisobutylene (PIB). Of these materials, EVA is a sealing resin preferable in terms of price and the adhesion with the substrate 11. In terms of light resistance, polyvinylbutyral is preferable.

The transparent sealing film 14 protects the solar cell module when the module is installed outdoors. It should therefore excel in moisture resistance and water resistance, as well as insulating property. It suffices that the sealing film 14 comprises a fluorine resin film such as a polyvinylfluoride film (for example, Tedler Film (registered trademark)) or a resin film such as a polyethyleneterephthalate (PET) film, provided on the side adjacent to the sealing resin layer 13. The sealing film 14 may be of a single-layer structure consisting of the organic film mentioned above, or of a multi-layer structure. A preferred example of the resin film is a fluorine resin film. The rear sealing member is not limited to the resin film 14. It may be a glass plate having the same size as that of the substrate 11. The sealing of the rear of the module with the transparent sealing resin and the sealing member may be carried out by an ordinary by heating under pressure. Needless to say, the sealing resin fills the gap (light-transmitting window 112) between the segments 12 shown in FIG. 1.

Figure 3:
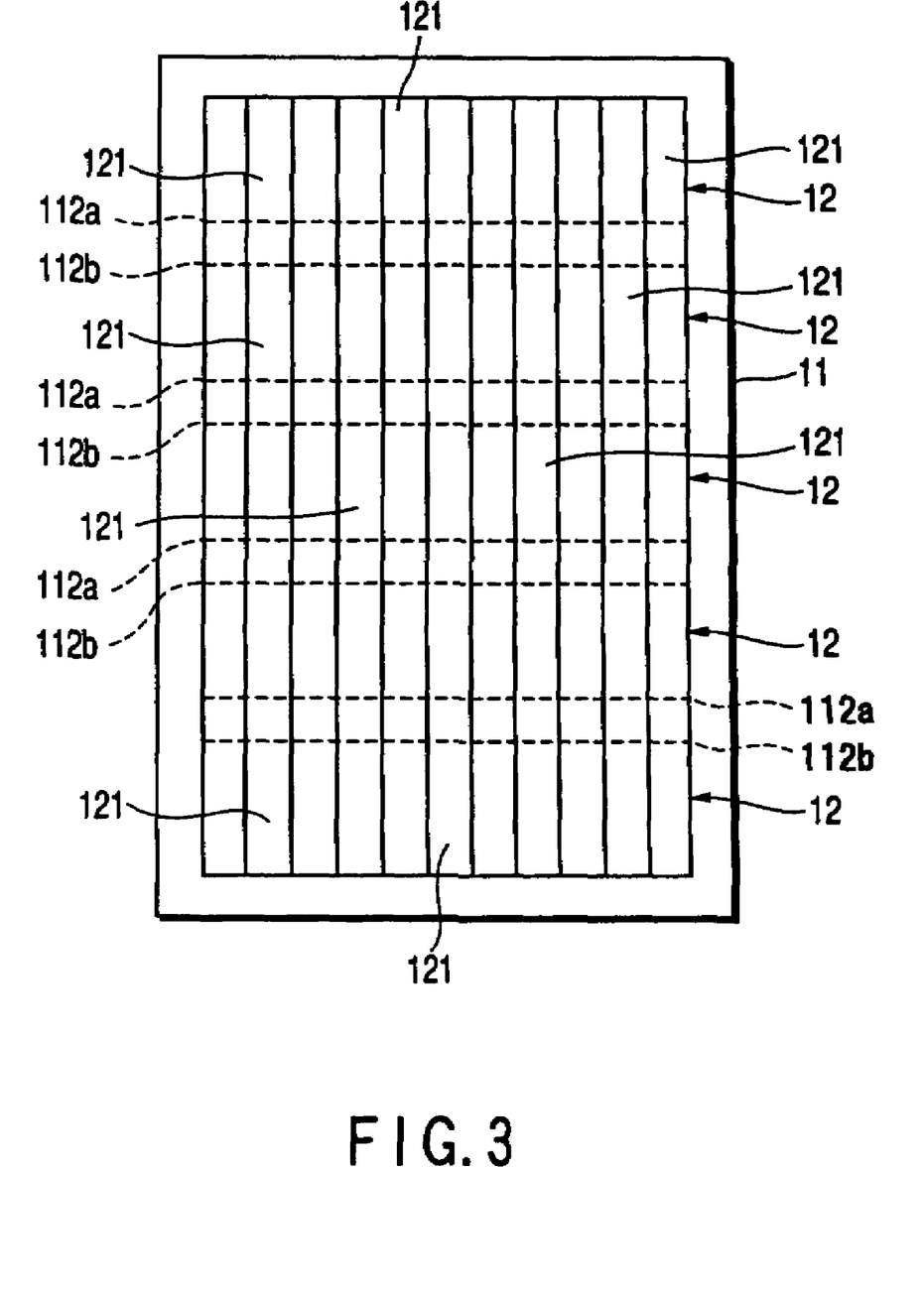
FIG. 3 is a plan view illustrating a method of manufacturing a see-through type, thin-film solar cell module shown in FIG. 1.

The see-through-type, thin-film solar cell module of the present invention can be manufactured in the following manner. First, thin-film solar cell, having the integrated unit cells (also called "strings"), is formed on substantially the entire surface of the glass substrate 11 as described above, and then those portions of the rear electrode, photovoltaic unit and transparent electrode which lie on the peripheral region 111 are removed. Further, those portions of the rear electrode, photovoltaic unit and transparent electrode which are provided in a region between broken lines 112a and 112b shown in FIG. 3, i.e., in a region corresponding to the window 112 shown in FIG. 1, are removed. More specifically, after removing the rear electrodes, photovoltaic units and transparent electrodes from the peripheral region 111, two pairs of parallel separation grooves 112a and 112b, each pair defining a window 112, are made in the integrated thin-film solar cell (FIG. 3) by laser scribing. Then, the cell portion in the region between the parallel grooves 112a and 112b of each pair is removed by polishing using, for example, sandblasting or grinding. That portion of the glass substrate 11 (i.e., window 112) which is exposed by the polishing assumes a state of frosted glass. Nonetheless, the window 12 regains transparency when the transparent sealing resin is filled to the window 112. In the case where cell portions arranged in a line crossing each string, the unit cells 121 in each segment 12 remain electrically connected. Alternatively, the cell portions arranged in a line parallel to the strings may be removed. In this case, however, an additional step must be performed to connect the strings electrically.

The see-through type thin-film solar cell module of the present invention may be built in an edifice, in the form of a window or a top light. In such a case, the external light does not pass through the section of the solar cell segment 12, but passes through the region (window 112) that lies between segments 12. It is therefore possible to provide a so-called "blind-tone light-transmitting structure" which has not been hitherto achieved.

For the see-through type, thin-film solar cell module of the invention, which has blind-tone light-transmitting structure, it is desirable that a plurality of solar cell segments be provided on substantially the entire surface of the light-transmitting substrate 11 as shown in FIG. 1, with a light-transmitting window 112 interposed between any two adjacent segments 12. Nevertheless, the blind-tone light transmitting structure may be formed at a portion of the light-transmitting substrate 11, for example at the upper half, lower half or central portion of the substrate 11.

The see-through type, thin-film solar cell module described with reference to FIGS. 1 and 2 is individually sealed with the rear sealing member. Nonetheless, solar cell modules of the type shown in FIGS. 1 and 2 may be collectively sealed with a single large light-transmitting rear sealing member, forming a solar cell panel. More specifically, solar cell modules may be arranged close to each other on a large light-transmitting rear sealing member, with transparent sealing resin contacting the light-transmitting sealing member. In the solar cell panel, the solar cell segments can be electrically connected in various ways (in series and/or parallel), generating a desired voltage. The output voltage of the solar cell panel can therefore be easily adjusted to, for example, the input voltage of a power conditioner (usually 200 to 250V).

FIGS. 4A to 5B show examples of solar cell panels. As shown in FIGS. 4A to 5B, solar cell modules (four modules in these Figures) 10 of the type illustrated in FIG. 1 are arranged adjacent to one another, on a single large-sized transparent rear sealing member 21 (for example, transparent resin film or glass plate). The solar cell modules 10 are adhered to the rear sealing member 21 with a sealing resin (not shown) of the type described above. The thick lines shown in FIGS. 4A to 5B indicate electric connection line.

Figure 4A:
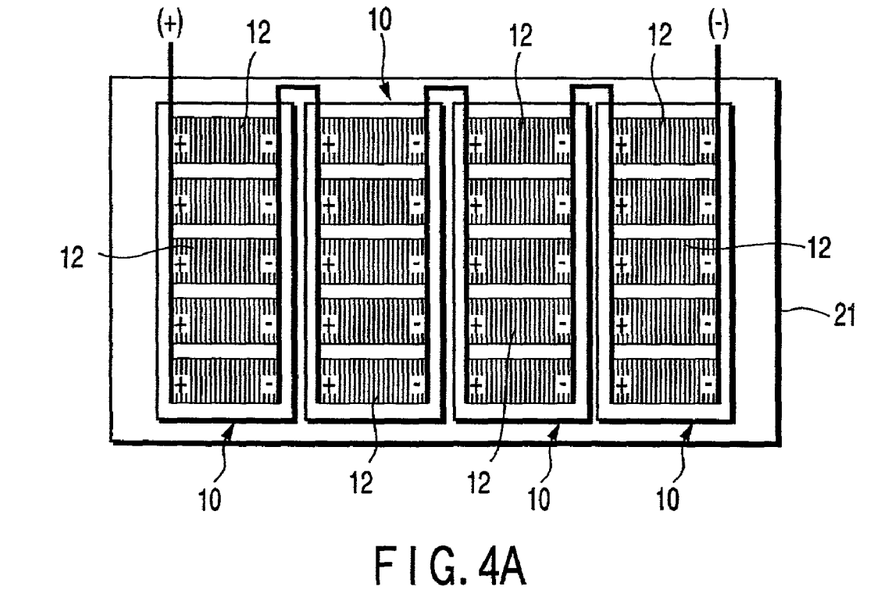
FIGS. 4A and 4B are plan views showing different see-through type, thin-film solar cell panels, each having a plurality of solar cell modules sealed together.

FIG. 4A illustrates a solar cell panel of a 4-series, 5-parallel connection structure, which comprises five solar cell modules 10 each including five solar cell segments 12. In the solar cell panel, the five segments 12 of each module 10 are connected in parallel and the four modules 10 are connected in series. Assume that each solar cell segment includes 50 unit cells, and the open-circuit voltage Voc of each solar cell segment is 40V. In this case, the open-circuit voltage Voc of the solar cell panel will be 160V.

Figure 4B:
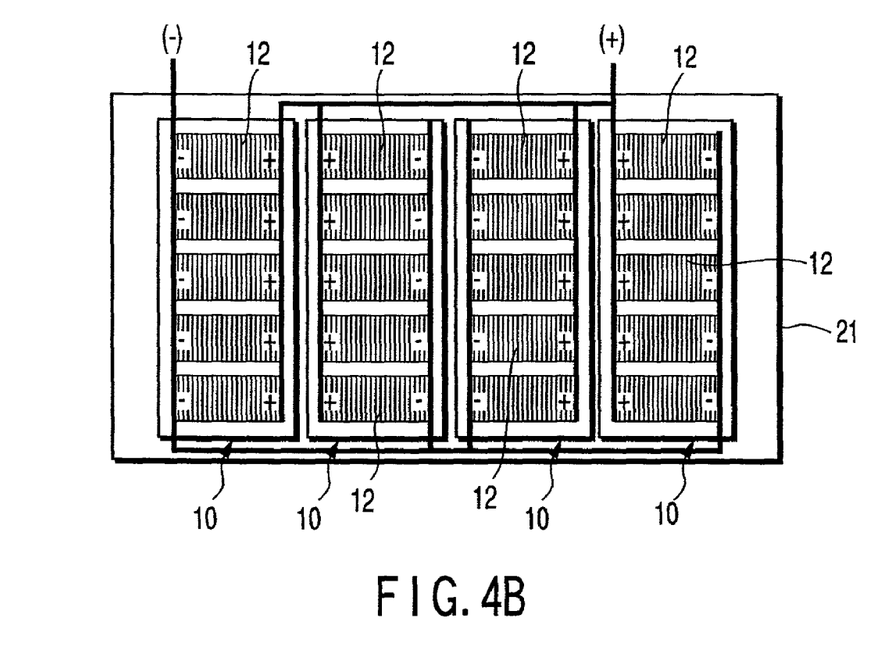

FIG. 4B illustrates a solar cell panel of a 1-series, 20-parallel connection structure, which comprises four solar cell modules 10 each including five solar cell segments 12. In this solar cell panel, the five segments 12 of each module 10 are connected in parallel and the four modules 10 are connected in parallel, too. Assume that each solar cell segment includes 50 unit cells, and the open-circuit voltage Voc of each solar cell segment is 40V. In this case, the open-circuit voltage Voc of the solar cell panel will be 40V.

Figure 5A:
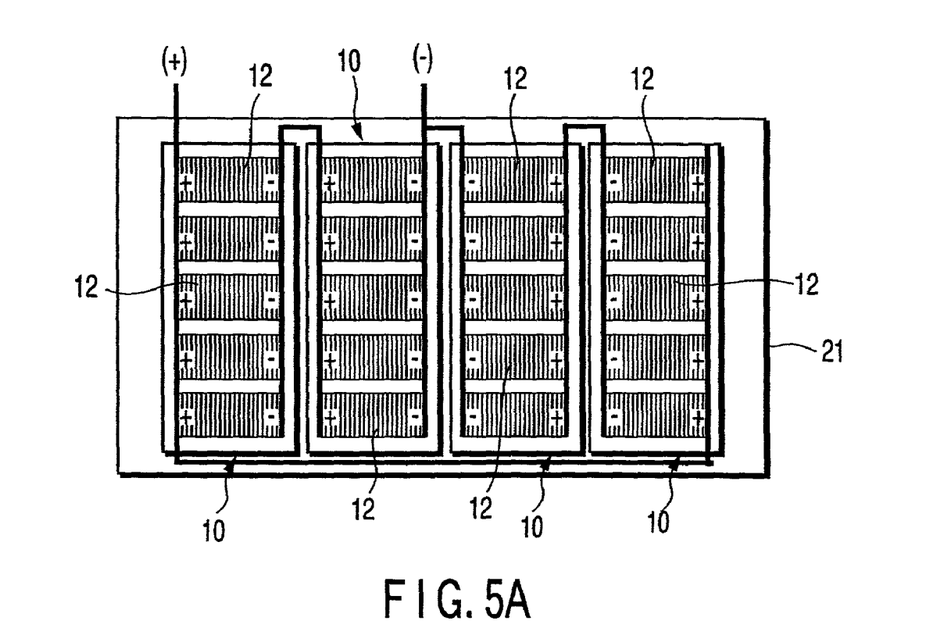
FIGS. 5A and 5B are plan views illustrating different see-through type, thin-film solar cell panels, each having a plurality of solar cell modules sealed together.

FIG. 5A depicts a solar cell panel of a 2-series, 10-parallel connection structure, which comprises four solar cell modules 10 each including five solar cell segments 12. In this solar cell panel, the five segments 12 of each module 10 are connected in parallel, the two left modules 10 are connected in series, the two right modules 10 are connected in series, the left most and right most modules 10 are connected in parallel, and the two middle modules 10 are connected in parallel. Assume that each solar cell segment includes 50 unit cells, and the open-circuit voltage Voc of each solar cell segment is 40V. In this case, the open-circuit voltage Voc of the solar cell panel will be 80V.

Figure 5B:
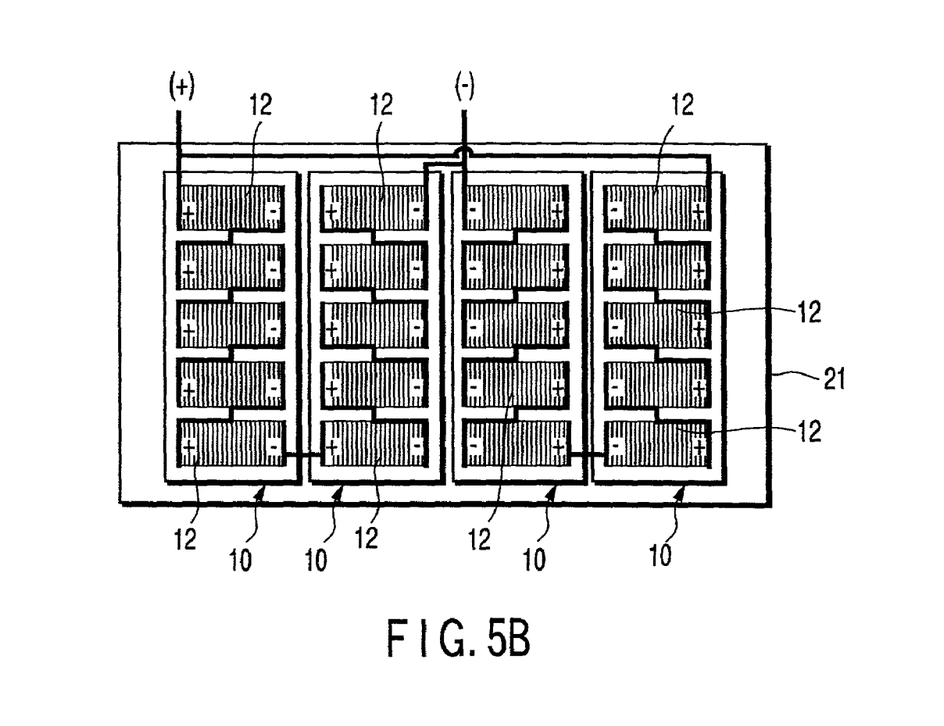

FIG. 5B illustrates a solar cell panel of a 10-series, 2-parallel connection structure, which comprises four solar cell modules 10 each including five solar cell segments 12. In the solar cell panel, the five segments 12 of each module 10 are connected in series, the two left modules 10 are connected in series, the two right modules 10 are connected in series, the left most and right most modules 10 are connected in parallel, and the two middle modules 10 are connected in parallel. Assume that each solar cell segment includes 50 unit cells, and the open-circuit voltage Voc of each solar cell segment is 40V. In this case, the open-circuit voltage Voc of the solar cell panel will be 400V.

If the solar cell modules of the type shown in FIG. 1 are arranged adjacent to one another on a single transparent rear sealing member, thus forming a solar cell panel, the panel can generate a desired output voltage by connecting the segments of each module and the modules appropriately (in series or parallel), as explained with reference to FIGS. 4A to 5B.

As described above, a thin-film, solar cell module, which can be manufactured by a simple method has a blind-tone see-through structure and has not been hitherto achieved, can be provided according to one aspect of the present invention.

Figure 6:
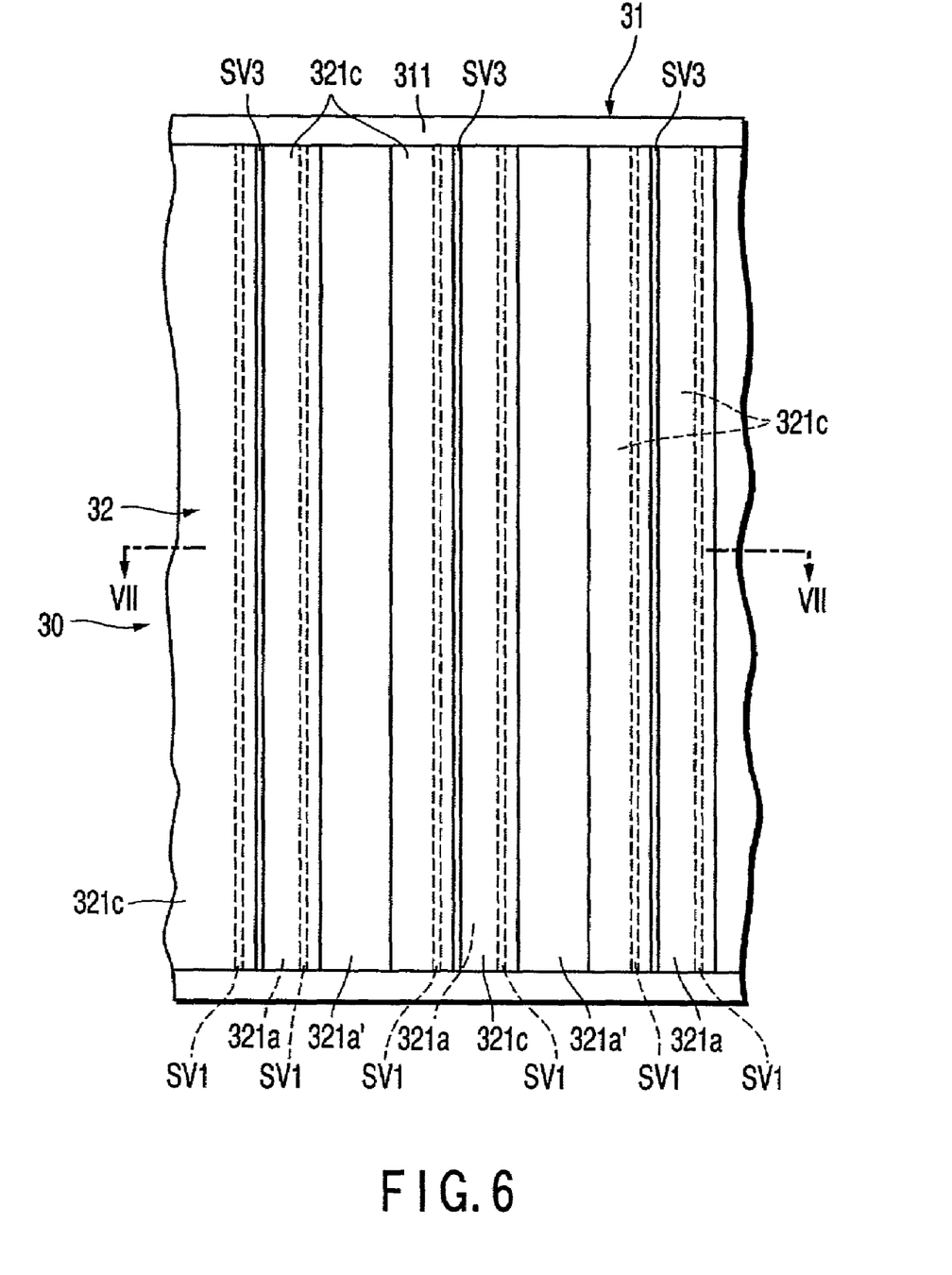
FIG. 6 is a plan view of a see-through type, thin-film solar cell module according to another embodiment of the present invention.
Figure 7:
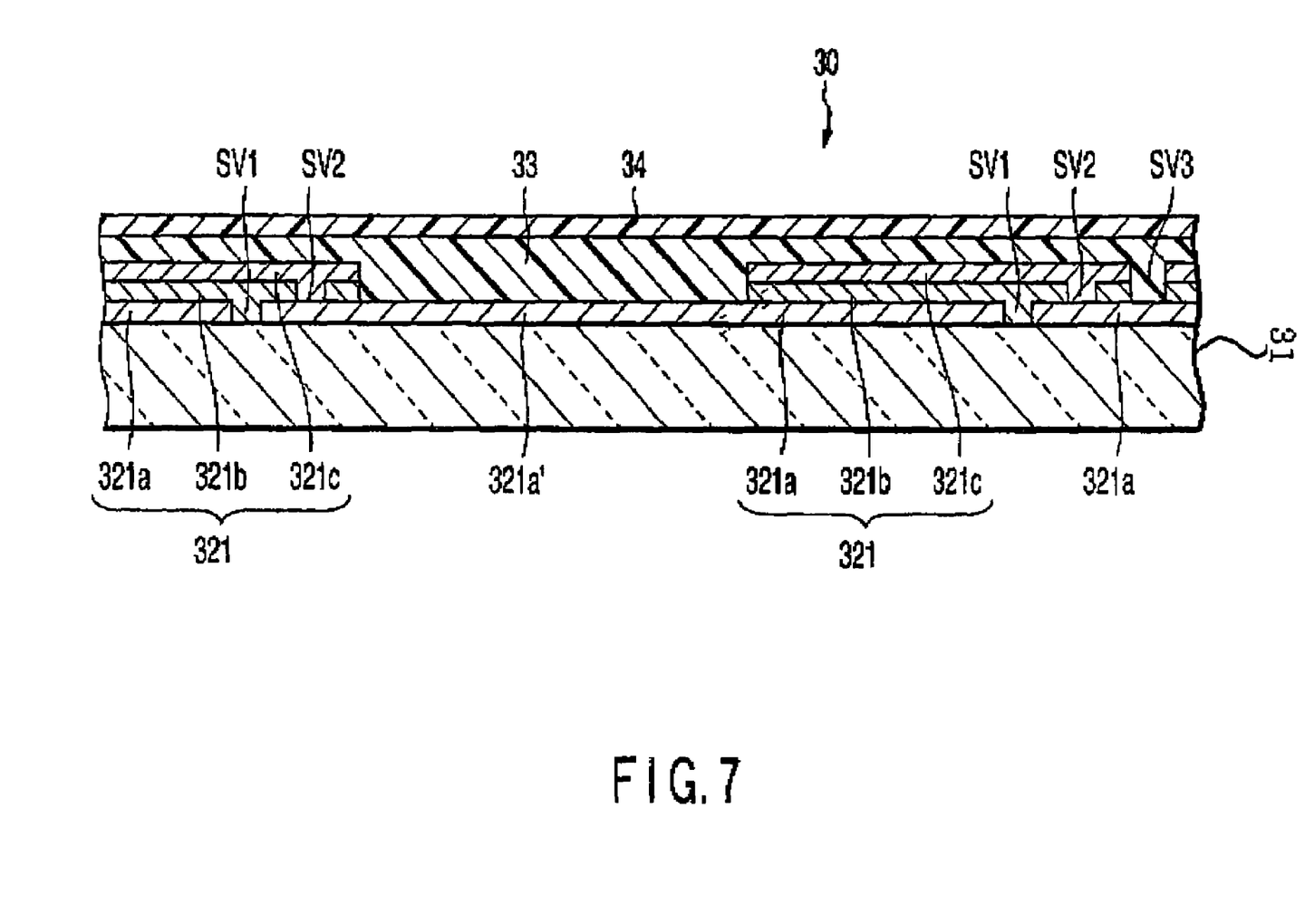
FIG. 7 is a enlarged view showing a portion of the cross section view taken along the line VII—VII in FIG. 6.

FIG. 6 is a plan view of a see-through type, thin-film solar cell module according to another embodiment of the present invention. FIG. 7 is an enlarged view showing a portion of the cross section taken along the line VII—VII in FIG. 6. For simplicity, the transparent sealing resin layer and sealing member shown in FIG. 7 are not shown in FIG. 6.

The see-through type thin-film solar cell module 30 shown in FIGS. 6 and 7 comprises an integrated thinfilm solar cell structure 32. The solar cell structure 32 is provided on a light-transmitting (transparent) substrate 31 (for example, glass substrate) that has a rectangular surface, covering one entire surface of the substrate 31, but the peripheral portion 311. The substrate 31 may have a size of, for example, 910 mm×455 mm. Nonetheless, it may have a size of 910 mm×910 mm (square). The peripheral region 311 of the substrate 31 may be 5 mm to 150 mm wide.

The integrated thin-film solar cell structure 32 is of a type in which solar cell unit cells (also called "strings") are integrated and has an ordinary structure as best illustrated in FIG. 7. More specifically, the integrated solar cell structure 32 includes a plurality of unit cells 321 integrated on the light-transmitting substrate 31. Each unit cell 321 comprises a transparent front electrode layer 321a, an amorphous silicon-based photovoltaic unit 321b, and a rear metal electrode layer 321c. The layer 321a, unit 321b and layer 321c are formed on the transparent substrate 31, laid one upon another in the order mentioned.

The transparent front electrode layer 321a provided on the glass substrate 31 can be made of a transparent electrically conductive oxide such as ITO, $SnO_2$ or ZnO. The electrode layer 321a may be of a single-layer or multi-layer structure. Either structure can be formed by a vapor deposition process known per se in the art, such as evaporation, CVD or sputtering.

The amorphous silicon-based photovoltaic unit 321b, which is formed on the transparent front electrode layer 321a, is a multi-layer structure. The unit 321b comprises a p-type amorphous silicon-based semiconductor layer, an amorphous silicon-based thin-film photovoltaic conversion layer and, an n-type silicon-based semiconductor layer, not shown in the Figures. These three layers are formed on the electrode layer 321a, one upon another in the order mentioned. The p-type amorphous silicon-based semiconductor layer, amorphous silicon-based thin-film, photovoltaic conversion layer and n-type silicon-based semiconductor layer can be formed by a plasma CVD process. The p-type amorphous silicon-based semiconductor layer may be made of silicon, silicon hydride (Si:H) or an amorphous silicon-based semiconductor material (e.g., a silicon alloy such as silicon carbide or silicon germanium). This semiconductor layer is doped with p-type conductivity determining impurity atoms such as boron atoms or aluminum atoms. The photovoltaic conversion layer may be formed of an intrinsic semiconductor such as silicon (or silicon hydride) or an amorphous silicon-based semiconductor material (e.g., a silicon alloy such as silicon carbide or silicon germanium). Alternatively, a weak p-type or weak n-type amorphous silicon-based semiconductor material that contains a very small amount of a conductivity-type determining impurity may be used for the photovoltaic conversion layer, provide that the material has a sufficient photovoltaic conversion function. Usually, the photovoltaic conversion layer is formed to a thickness ranging of 0.1 µm to 10 µm. The n-type silicon-based semiconductor layer may be made of silicon, or silicon hydride or an amorphous silicon-based semiconductor material (e.g., a silicon alloy such as silicon carbide or silicon germanium). This semiconductor layer is doped with n-conductivetype determining impurity atoms such as phosphorous atoms or nitrogen atoms. Alternatively, the n-type silicon-based semiconductor layer may be made of an n-type microcrystalline silicon hydride.

The rear electrode layer 321c, which is provided on the photovoltaic unit 321b, can be formed of a metallic material such as silver, aluminum, chromium or titanium, by means of, for example, evaporation or sputtering.

The transparent front electrode layer 321a, the amorphous silicon-based photovoltaic unit 321b and the rear electrode layer 321c, all described above, are divided into a plurality of unit cells 321 by, for example, laser scribing. More specifically, the transparent front electrode layer 321a is divided by separation grooves SV1; the photovoltaic unit 321b is divided by separation grooves SV2 (not shown in FIG. 6); and the rear electrode layer 321c is divided by separation grooves SV3. The unit cells 321 are electrically connected in series or in parallel. As is clear from FIG. 6, the transparent front electrode layer 321a, amorphous silicon-based photovoltaic unit 321b and rear electrode layer 321c extend parallel to one side of the rectangular substrate 31.

The peripheral region 311 of the glass substrate 31 has been subjected to, for example, sandblasting. The rear electrode layer, photovoltaic unit and transparent front electrode layer, which have been deposited for the manufacture of the cell 321, are thereby removed, exposing the glass substrate 31 at the peripheral region 311 as is shown in FIG. 6. Now that the glass substrate 31 is so exposed, the substrate can be firmly adhered to a sealing resin, which will be explained later.

In the integrated thin-film solar cell module so fabricated, only the transparent front electrode layer 321a' is formed in the specified string-corresponding regions (two regions in FIG. 6), and the photovoltaic unit 321b and the rear electrode layer 321c are not provided. Therefore, the front electrode layer 321a' is exposed. The exposed portion of the front electrode layer provides a light-transmitting window.

The exposed transparent front electrode layer 321a' is formed continuous to the transparent front electrode 321a of one string (see, particularly, FIG. 7) to ensure the flow of electric current in the integrated thin film solar cell structure, i.e., the current flow from the transparent front electrode layer 321a, photovoltaic unit 321b and back electrode layer 321c of one string to those of the other string in adjacent strings sandwiching the transparent front electrode layer 321a'.

The thin-film solar cell module 30 of the see-through structure described above can be manufactured as follows. First, a transparent front electrode layer is formed on substantially the entire surface of a light-transmitting substrate 31. Then, the separation grooves SV1 are formed by laser scribing. Separation grooves, which are required in the case of forming strings, axe not formed in a region where the light-transmitting window 321a' will be formed. Thereafter, the photovoltaic unit is formed on the entire surface, and separation grooves SV2 are made. Then, a rear electrode layer is formed on the entire surface, and the separation grooves SV3 are made. Then, those portions of the rear electrode layer and photovoltaic unit, which lie on the light-transmitting window 321a', are removed by a removing process such as etching or laser removal The front transparent electrode layer 321a' of the light-transmitting window is thereby exposed. A solvent may be used in the removal by etching. If this is the case, an aqueous solution of an acid such as hydrochloric acid, nitric acid, acetic acid or phosphoric acid and a mixture of these can be used to remove the portion of the rear electrode layer, and an aqueous solution of, for example, carbon tetrafluoride or sodium hydroxide can be used to remove the portion of the photovoltaic unit.

Another method of manufacturing the thin-film solar cell module having a see-through structure of FIGS. 6 and 7 will be described. First, a transparent front electrode layer is formed, and the separation grooves SV1 are made, as described above. Then, a region where a light-transmitting window 321a' will be formed is covered with a mask. A photovoltaic unit is formed on the entire surface of the resultant structure, and the separation grooves SV2 are made. Then, a rear electrode layer is formed on the entire surface, and the separation grooves SV3 are made. Thereafter, those portions of the rear electrode layer and photovoltaic unit, which lie on the mask, are removed, thus exposing the window 321a'.

As shown in FIG. 7, the rear of the solar cell module is sealed and protected by a transparent sealing member, for example, a transparent film 34, through a transparent sealing resin layer (adhesive layer) 33.

The transparent sealing resin used is of a type that can seal entirely the unit cells 321 provided on the light-transmitting substrate 31 and which can firmly adhere to the sealing member such as the protection film 34. The resin can soften and eventually melt when heated, and can then cure. Usually, an organic peroxide-based cross-linking agent is blended in the resin. Examples of the resin are thermoplastic resins such as ethylene/vinyl acetate copolymer resin (EVA), ethylene/vinyl acetate/triallylisocyanurate copolymer resin (EVAT), polyvinylbutyral (PVB) and polyisobutylene (PIB). Of these resins, EVA is a sealing resin preferable in terms of price and the adhesion with the substrate. In terms of light resistance, polyvinylbutyral is preferable.

The transparent sealing film 34 protects the solar cell module when the module is installed outdoors. The film 34 should therefore excel in moisture resistance and water resistance, as well as insulating property. It suffices that the sealing film 34 comprises a fluorine resin film such as a polyvinylfluoride film (for example, Tedler Film (registered trademark)) or a resin film such as a polyethyleneterephthalate (PET) film, provided on the side adjacent to the sealing resin layer 13. The sealing film 14 may be of a single-layer structure consisting of the organic film mentioned above, or of a multi-layer structure. A preferable example of the resin film is a fluorine resin film. The rear sealing member is not limited to the resin film 34; it may be a glass plate having the same size as that of the substrate 31. The sealing of the rear of the module with the transparent sealing resin and sealing member may be carried out by an ordinary method by heating under pressure. Needless to say, the sealing resin fills the region (light-transmitting window 312) between the segments 32 shown in FIG. 6.

Figure 8:
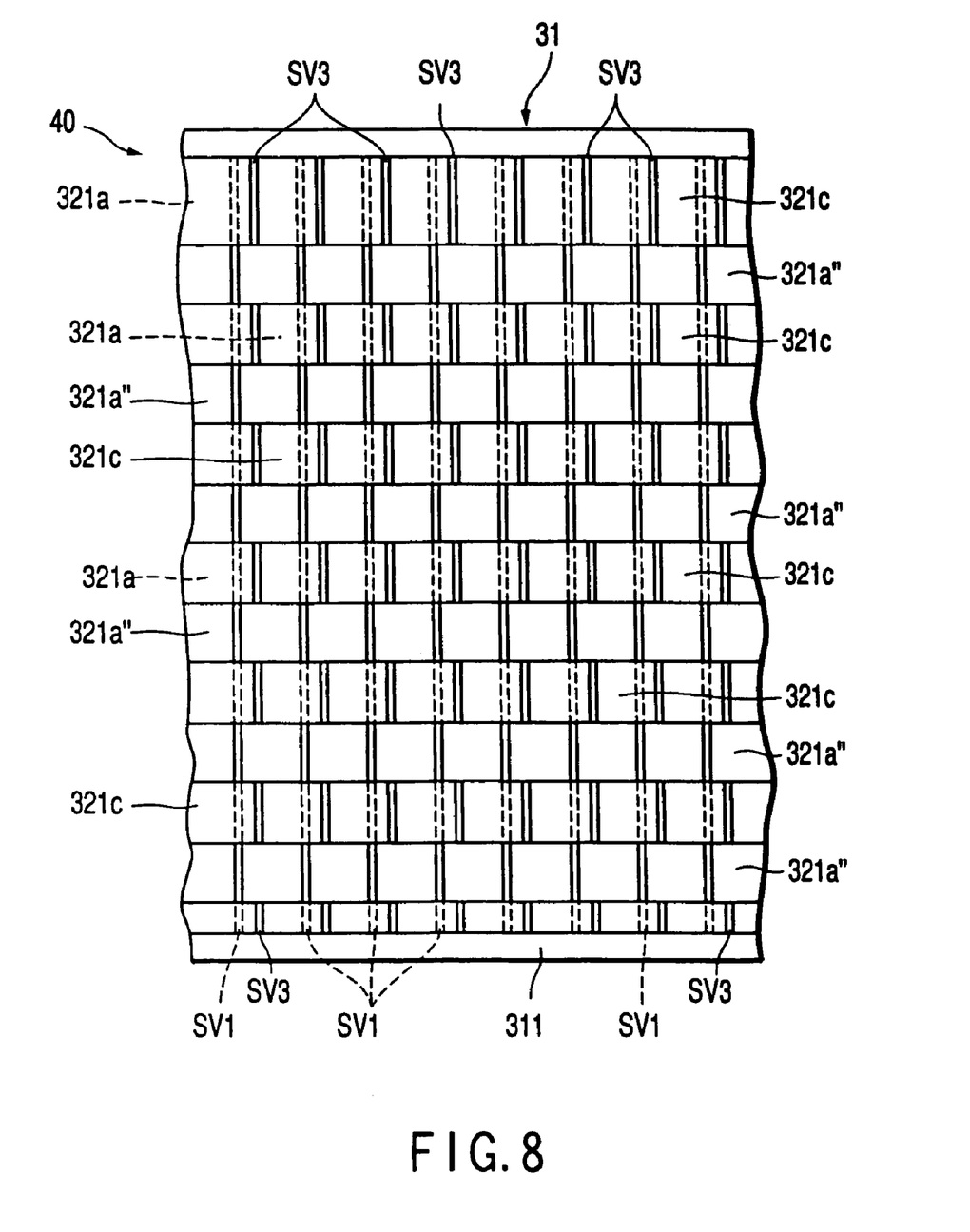
FIG. 8 is a plan view of a see-through type, thin-film solar cell module according to still another embodiment of the present invention.

FIG. 8 illustrates a see-through type, thin-film solar cell module 40 according to another embodiment of the present invention, in which light-transmitting windows 321a", or the exposed portions of the transparent front electrode layer, are arranged at intervals in a direction crossing the strings and parallel to one another. The rear of the module is sealed with a transparent sealing resin layer and a sealing member (not shown in FIG. 8 for simplicity) as in the module shown in FIGS. 6 and 7.

The solar cell module 40 shown in FIG. 8 can be manufactured in the following manner. First, an integrated thin-film, solar cell structure is formed on a light-transmitting substrate 31 by an ordinary method. Then, those portions of a rear electrode layer and a photovoltaic unit, which are present on the regions where the window 321a" will be provided, are removed by a removing process such as etching or laser removing to expose the corresponding portions of the front transparent electrode layer 321a', thus providing light-transmitting windows. A solvent may be used in the removal by etching. If this is the case, an aqueous solution of an acid such as hydrochloric acid, nitric acid, acetic acid or phosphoric acid and a mixture of these can be used to remove the portion of the rear electrode layer, and an aqueous solution of, for example, carbon tetrafluoride or sodium hydroxide can be used to remove the portion of the photovoltaic unit.

Alternatively, the solar cell module 40 shown in FIG. 8 may be formed in the following way. In forming an integrated thin-film solar cell structure on the light-transmitting substrate 31 by the ordinary method, the transparent front electrode layer is divided, and then regions, in which light-transmitting windows will be provided, are masked. Thereafter, the photovoltaic unit is formed on the entire surface, the separation grooves SV2 are made, the rear electrode layer is formed on the entire surface, and separation grooves SV3 are made by the ordinary method. Then, those portions of the rear electrode layer and photovoltaic unit, which lie on the mask, are removed, thus providing windows 321a".

In the solar cell module 40 of FIG. 8, the unit cells adjacent to each other in the direction crossing the strings are electrically connected to each other, ensuring the current flow through the module, because the transparent front electrode layer is continuous over the substrate. Hence, it is not necessary to provide an additional device for ensuring the flow of the current as in the solar cell module shown in FIGS. 6 and 7.

In the see-through type thin-film solar cell modules shown in FIGS. 6 to 8, the external light does not pass through the unit cells 321 when the modules are built in an edifice in the form of a window or top light. Nevertheless, the external light passes through the windows 321a' or 321a". Thus, the modules provide a so-called "blind-tone light-transmitting structure" that has not been hitherto provided.

It is preferable that the see-through type, thin-film solar cell module of the present invention have the structures shown in FIGS. 6 to 8, in which the module is provided on substantially the entire surface of the light-transmitting substrate 31. Alternatively, the blind-tone light transmitting structure can be formed at a portion of the light-transmitting substrate 31, for example in the upper or lower half or central portion. Further, to expose a portion of the front transparent electrode layer to provide a light-transmitting window, it suffices to remove those portions of the rear electrode layer and the photovoltaic unit, which lie on the light-transmitting window. Therefore it is possible to provide a see-through structure of an arbitrary pattern, such as a checker flag pattern. Even in such a case, the transparent front electrode layer, which is formed continuous over the substrate, ensure the electrical connection between the unit cells. This makes it unnecessary to provide additional electrical connections, resulting in better aesthetic appearance of the module.

As has been described, the present invention provides a thin-film solar cell module that can be manufactured by a simple method and has a see-through structure of an arbitrary pattern, which has not been achieved ever before.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a thin-film solar cell module of a see-through structure comprising:
   providing a light-transmitting substrate having a rectangular surface;
   providing a plurality of integrated thin-film solar cell segments on the entire surface of the substrate,
   removing a portion of each solar cell segment that overlies a peripheral portion of the substrate,
   wherein each solar cell segment comprises a plurality of integral unit cells electrically connected to form an integrated solar cell segment;
   exposing the surface of the substrate by removing a solar cell portion between two adjacent solar cell segments by polishing, and defining a gap comprising a light-transmitting window between the two adjacent solar cell segments,
   wherein the light-transmitting window separates and spaces apart the two adjacent solar cell segments and electrically isolates the two segments;
   and filling the gap between the two adjacent solar cell segments with a transparent resin.

2. The method according to claim 1, wherein said plurality of solar cell segments each comprises a transparent front electrode layer, a photovoltaic unit and a rear electrode layer.

3. The method according to claim 2 wherein the transparent front electrode layer, the photovoltaic unit and the rear electrode layer of said plurality of solar cell segments extend in parallel to short sides of said substrate.

4. The method according to claim 1, further comprising a transparent sealing member configured to cover said plurality of solar cell segments, wherein said transparent sealing member is bonded to said substrate at the peripheral portion thereof.

5. The method according to claim 1, wherein said polishing is performed by sandblasting or grinding.

6. The method according to claim 5, wherein said polishing causes the light-transmitting substrate to lose its transparency, and the transparency of the light-transmitting window is provided by the transparent resin.

7. The method according to claim 1, wherein the light-transmitting window has a width of 0.5 to 50 mm.

8. The method according to claim 1, also comprising:
   providing a transparent sealing film on the transparent; and
   filling a gap between the two adjacent solar cell segments with a transparent resin includes selecting a transparent resin that firmly adheres to the transparent sealing film.

9. The method according to claim 1, also comprising:
   providing a transparent sealing film on the transparent resin; and
   providing a transparent sealing film includes providing a fluorine resin film.

10. A see-through, thin-film solar cell panel comprising:
    a light-transmitting sealing member; and
    a plurality of thin-film solar cell modules prepared according to claim 1, provided adjacent to one another on the light-transmitting sealing member such that the transparent resin of each module contacts the light-transmitting sealing member, wherein said modules are electrically connected to each other.

11. The panel according to claim 10, wherein the light-transmitting window has a width of 0.5 to 50 mm.

* * * * *